United States Patent [19]

McDonald

[11] Patent Number: 5,043,608
[45] Date of Patent: Aug. 27, 1991

[54] AVALANCHE PHOTODIODE NON-LINEARITY CANCELLATION

[75] Inventor: Kevin B. McDonald, Bend, Oreg.
[73] Assignee: Tektronix, Inc., Beaverton, Oreg.
[21] Appl. No.: 397,829
[22] Filed: Aug. 24, 1989
[51] Int. Cl.$^5$ .................... G01N 21/01; G06G 7/12
[52] U.S. Cl. ........................... 307/491; 356/73.1
[58] Field of Search .............. 307/490, 491, 311; 328/142; 356/73.1

[56] References Cited

U.S. PATENT DOCUMENTS

| | | | |
|---|---|---|---|
| 3,535,547 | 12/1967 | Webb | 307/490 |
| 3,993,959 | 11/1976 | Boctor | 307/491 |
| 4,068,254 | 1/1978 | Erdi | 307/491 |
| 4,546,275 | 10/1985 | Pena-Finol et al. | 307/498 |
| 4,651,032 | 3/1987 | Nobuta | 307/491 |
| 4,769,534 | 9/1988 | Brand | 250/214 R |
| 4,814,714 | 3/1989 | Beadle | 307/490 |
| 4,847,523 | 7/1989 | Schneider | 307/490 |
| 4,849,826 | 7/1989 | Ohta | 307/490 |
| 4,943,736 | 7/1990 | Kihara et al. | 307/491 |
| 4,959,560 | 9/1990 | Ootani | 307/491 |
| 4,989,971 | 2/1991 | McDonald | 356/73.1 |

OTHER PUBLICATIONS

Wohlmuth; IBM Tech. Disc. Bull.; "Video Function Generator"; vol. 13, #1, Jun. 1970, p. 65.

Primary Examiner—Stanley D. Miller
Assistant Examiner—T. Cunningham
Attorney, Agent, or Firm—Francis I. Gray; William K. Bucher

[57] ABSTRACT

An avalanche photodiode non-linearity correction circuit cancels a portion of a non-linear recovery error response by the APD to an input signal by using the fact that the non-linear recovery error is only mildly dependent upon the APD gain. The gain of the APD is varied from data acquisition cycle to data acquisition cycle, with the acquired data being stored. The stored data from consecutive data acquisition cycles are combined in a summation circuit to effectively cancel a significant portion of the non-linear recovery error response.

6 Claims, 1 Drawing Sheet

AVALANCHE PHOTODIODE NON-LINEARITY CANCELLATION

BACKGROUND OF THE INVENTION

The present invention relates to error correction circuits, and more particularly to an avalanche photodiode (APD) non-linearity cancellation circuit for cancelling a portion of the output current tail from the APD using the fact that the current tail is only mildly dependent upon the gain of the APD.

When an optical signal, which is received by an APD, changes amplitude abruptly from a high to a low level, the output current of the APD exhibits a non-linear recovery, or tail, from the high level signal that swamps any low level signal that also may be present. This phenomenon limits, for example, the spatial resolution of optical time domain reflectometers.

In optical time domain reflectometers there have been different masking techniques used to attempt to limit this tail. For example in U.S. Pat. No. 4,769,534, issued Sept. 6, 1988 to Donald L. Brand entitled "Optical Detector with Storage Effects Reduction", an optical switch is interposed between the received optical signal and the optical detector to mask the high level signals from being passed to the optical detector during non-sampling intervals. The optical switch is controlled so that the switch closes only when the received optical signal is to be samples.

Another method using an optical switch is disclosed in co-pending U.S. patent application No. 07/379,852, filed by Kevin B. McDonald on July 14, 1989 entitled "Automatic Mask Trigger for an Optical Time Domain Reflectometer", where a portion of the electrical output signal is compared with a portion of the optical input signal to generate a switch control signal to pass the optical input signal, after a delay interval, to the optical detector only in the absence of high level signals.

Manual methods also have been employed that require an operator to observe an initial acquisition of data, and then via a cursor or other means to signal the optical switch to turn off on subsequent data acquisitions at high level times.

What is desired is a technique for automatically correcting for the non-linearity of the output tail of an APD in response to the transition from a high signal to a low signal in order to increase the spatial resolution of an optical time domain reflectometer.

SUMMARY OF THE INVENTION

Accordingly the present invention provides an avalanche photodiode non-linearity correction circuit that uses the fact that the non-linearity is only mildly dependent upon the gain of the APD. An input optical signal is converted and amplified by the APD, with the bias voltage, and thus the gain, of the APD being varied from one data acquisition cycle to the next. Data acquisition cycles of data are stored alternately in storage devices, and then read out so that two consecutive data acquisition cycles of data are read out simultaneously. The data are combined in a summation device to effectively cancel a significant portion of the tail, leaving essentially only the electrical equivalent of the input optical signal as the output.

The objects, advantages and other novel features of the present invention are apparent from the following detailed description when read in conjunction with the appended claims and attached drawing.

DESCRIPTION OF THE PREFERRED EMBODIMENT

Figure 1:
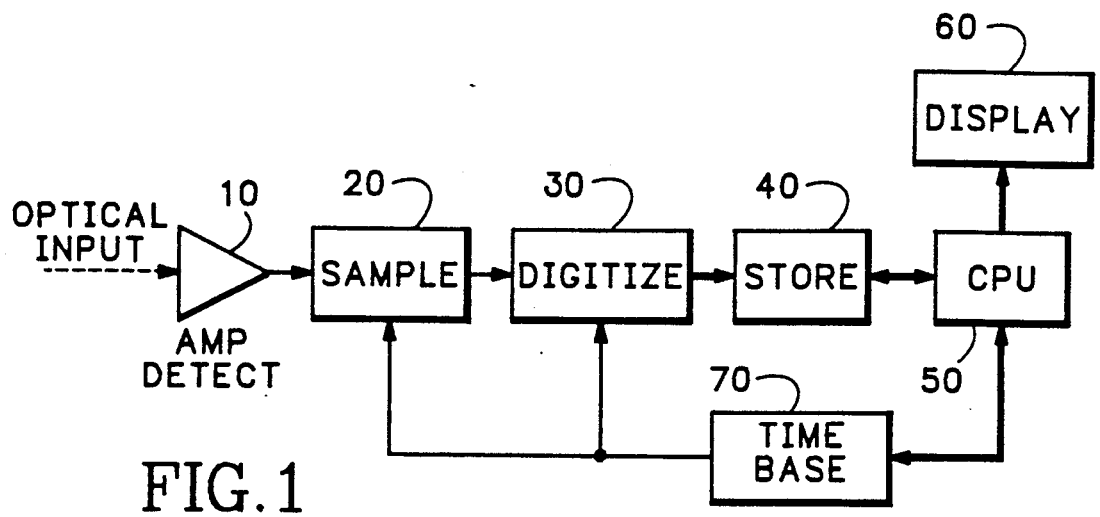
FIG. 1 is a block diagram of a portion of an instrument using the APD non-linearity cancellation technique of the present invention.
Figure 2:
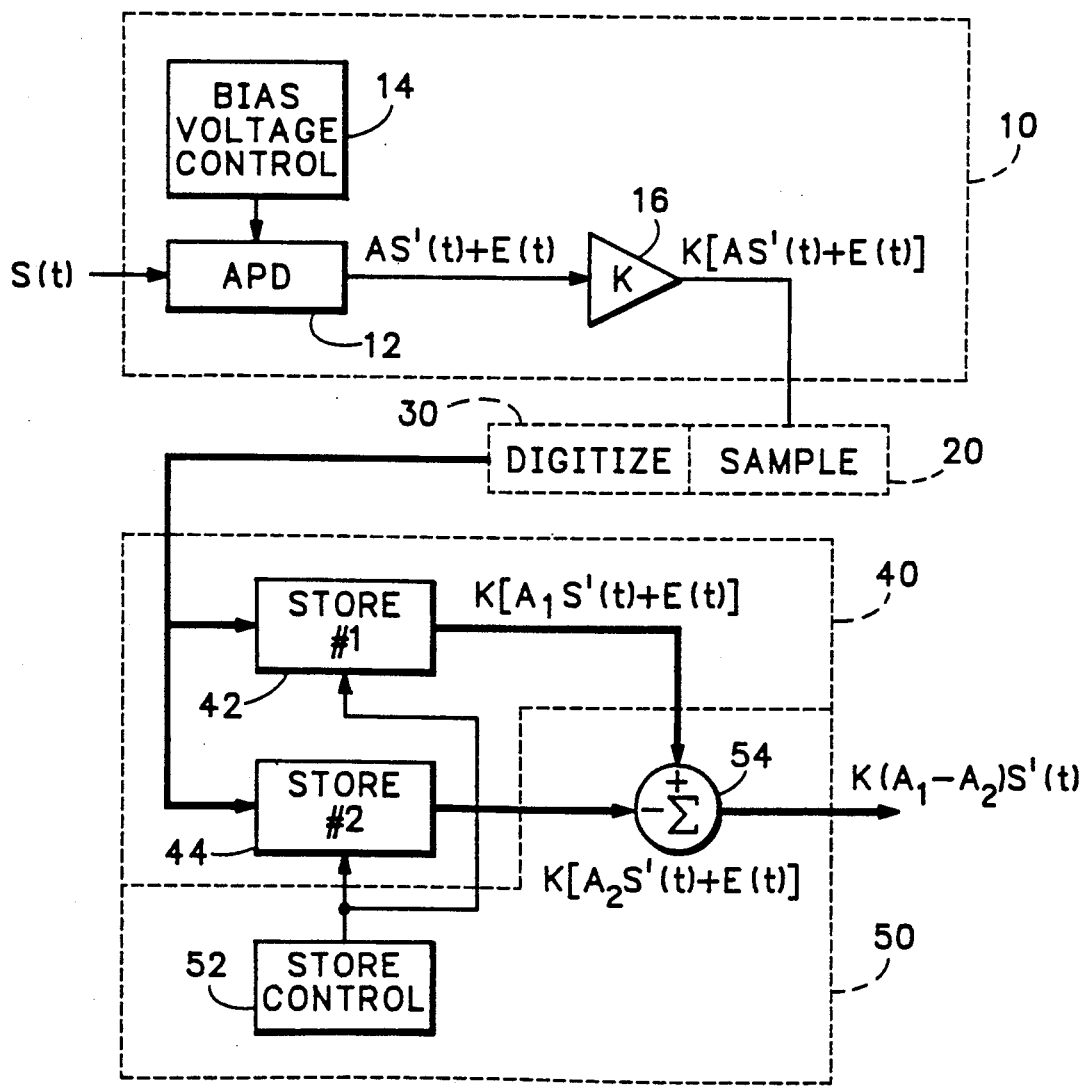
FIG. 2 is a block diagram of an avalanche photodiode non-linearity correction circuit illustrating the operation of the present invention.

Referring now to FIG. 1 an optical input signal is input to an amplifier/detector circuit 10 to convert the optical energy into electrical energy. The resulting electrical signal is input to a sample circuit 20 that samples the electrical signal at predetermined time intervals. The sampled electrical signal is input to a digitizer circuit 30 where it is converted into a series of digital data words. The digital data words are stored in a storage device 40. A microprocessor 50 accesses the digital data words and performs various operations upon them, such as averaging samples and performing the non-linearity cancellation technique of the present invention. The microprocessor 50 then transfers the processed digital data words to a display unit 60 for display. In operation as shown in FIG. 2 the input optical signal, $S(t)$, is input to an avalanche photodiode (APD) 12. The gain of the APD 12 is controlled by a bias voltage control circuit 14 to produce an output electrical signal, $AS'(t)+E(t)$, where A is the gain of the APD and $E(t)$ is the non-linear recovery error signal, or tail. The output electrical signal from the APD 12 is buffered by an amplifier 16 having a gain of K, and then after digitizing input to a pair of storage devices 42, 44. A storage control circuit 52 determines into which storage device 42, 44 the electrical signal from the buffer amplifier 16 is written. The outputs from the storage devices 42, 44 are input to a summation circuit 54 to produce a final output electrical signal that has a portion of the tail cancelled.

For a first data acquisition cycle the gain of the APD 12 is set by the bias voltage control circuit 14 to A1, and on the next data acquisition cycle the gain of the APD is set to A2. The electrical signal representing the first data acquisition cycle, $K[A1*S'(t)+E(t)]$, is stored in the first storage device 42, and the electrical signal representing the next data acquisition cycle, $K[A2*S'(t)+E(t)]$, is stored in the second storage device 44. These consecutive electrical signals, having appreciably different gains from the APD 12, are then simultaneously input to the combining circuit 54 that acts as a subtractor to produce the final output electrical signal, $K(A1 - A2)*S'(t)$.

The storage devices 42, 44 may be a single memory having a capacity to store two complete acquisition cycles of data. Alternatively one storage device may be deleted with the data being stored on one acquisition cycle and being read out and combined directly with the data from the next acquisition cycle. The data may be averaged in each of the storage devices 42, 44 and then output to the combiner 54 to produce a final output for display that may be stored in a display memory or back into one of the storage devices. On the other hand the data may be input to the combiner 54 on alternate data acquisition cycles, and the output signal stored in another storage device or portion of memory and processed before being displayed. Although a digital implementation has been described, any similar combination, analog or digital or combination thereof, may be used so long as the result is to subtract one acquisition cycle of data with a low APD bias from another acquisition cycle of data with a high APD bias to reduce the tail error.

Thus the present invention provides an avalanche photodiode non-linearity correction circuit that effectively cancels a portion of the non-linear recovery error, or tail, from the APD by varying the APD gain from acquisition cycle to acquisition cycle, and subtracting the data from consecutive acquisition cycles to produce an output electrical signal.

What is claimed is:

1. A correction circuit for reducing non-linear errors in an output of a device having a gain where the gain of the device has no appreciable effect on the non-linear error in the output of the device comprising:
   means for acquiring data from the output of the device as during data acquisition cycles, the data acquisition means comprising a sampler and a digitizer;
   means for varying the gain of the device from one data acquisition cycle to the next; and
   means for combining the data from the data acquisition cycles to obtain an output signal having the non-linear error reduced.

2. A correction circuit as recited in claim 1 wherein the varying means comprises a bias voltage control circuit for the device, the gain of the device being a function of an output voltage from the bias voltage control circuit.

3. A correction circuit as recited in claim 1 wherein the combining means comprises:
   means for storing the data from consecutive data acquisition cycles; and
   means for subtracting the data of the data acquisition cycles from the storing means to produce the output signal.

4. A correction circuit for increasing the spacial resolution of an optical time domain reflectometer having an avalanche photodiode for receiving an optical signal from a fiber under test and outputting an electrical signal in a form of $AS'(t)+E(t)$ where A is the gain and $E(t)$ is a non-linear recovery error signal, the correction circuit comprising:
   means for acquiring data from the output of the avalanche photodiode during data acquisition cycles, the data acquisition means comprising a sampler and a digitizer;
   means for varying the gain of the avalanche photodiode from a first gain A1, during a first data acquisition cycle, to a second gain A2, during a subsequent data acquisition cycle; and
   means for combining the data from the data acquisition cycles to obtain an output having a form of $(A1-A2)*S(t)$ where the non-linear recovery error signal is reduced.

5. The correction circuit as recited in claim 4 wherein the varying means comprises a bias voltage control circuit for the avalanche photodiode, the gain of the avalanche photodiode being a function of the output voltage from the bias voltage control circuit.

6. The correction circuit as recited in claim 4 wherein the combining means comprises:
   means for storing the data from consecutive data acquisition cycles; and
   means for subtracting the data of the data acquisition cycles from the storage means to produce the output.

* * * * *